United States Patent [19]
Yeuochung et al.

[11] Patent Number: 5,541,441
[45] Date of Patent: *Jul. 30, 1996

[54] METAL TO METAL ANTIFUSE

[75] Inventors: Yen Yeuochung, San Jose; Shih-Oh Chen, Los Altos; Leuh Fang, Santa Clara; Elaine K. Poon, Campbell; James B. Kruger, Half Moon Bay, all of Calif.

[73] Assignee: Actel Corporation, Sunnyvale, Calif.

[ * ] Notice: The term of this patent shall not extend beyond the expiration date of Pat. No. 5,543,656.

[21] Appl. No.: 319,170

[22] Filed: Oct. 6, 1994

[51] Int. Cl.$^6$ .................................................. H07L 29/08
[52] U.S. Cl. ........................ 257/530; 257/50; 257/751; 257/767
[58] Field of Search ........................ 257/50, 530, 751, 257/767

[56] References Cited

U.S. PATENT DOCUMENTS

| | | | |
|---|---|---|---|
| 4,561,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchovski | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,194,759 | 3/1993 | El-Ayat et al. | 307/202.1 |
| 5,196,724 | 3/1993 | Gordon et al. | 257/530 |
| 5,233,217 | 8/1993 | Dixit et al. | 257/530 |
| 5,266,829 | 11/1993 | Hamdy et al. | 257/530 |
| 5,272,101 | 12/1993 | Forouhi et al. | 437/44 |
| 5,272,666 | 12/1993 | Tsang et al. | 257/530 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |
| 5,449,947 | 9/1995 | Chen et al. | 257/530 |
| 5,475,253 | 12/1995 | Look et al. | 257/530 |

FOREIGN PATENT DOCUMENTS

| | | |
|---|---|---|
| 8700969 | 7/1986 | European Pat. Off. . |
| 8702827 | 10/1986 | European Pat. Off. . |
| 0455414 | 4/1991 | European Pat. Off. . |
| 9213359 | 1/1992 | European Pat. Off. . |
| 9220109 | 4/1992 | European Pat. Off. . |
| 9303499 | 7/1992 | European Pat. Off. . |

OTHER PUBLICATIONS

Chapman, et al., "A Laser Linking Process For Restructurable VLSI", Cleo '82, Apr. 14–16, 1982, Phoenix, Arizona.

*Primary Examiner*—Robert P. Limanek
*Assistant Examiner*—David B. Hardy
*Attorney, Agent, or Firm*—D'Alessandro & Ritchie

[57] ABSTRACT

The antifuse structure of the present invention includes a bottom planarized electrode, an ILD disposed over the bottom electrode, an antifuse cell opening in and through the ILD exposing the bottom electrode, a first barrier metal layer disposed in the antifuse cell opening to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer, and a top electrode disposed over the second barrier metal layer.

8 Claims, 5 Drawing Sheets

METAL TO METAL ANTIFUSE

BACKGROUND OF THE INVENTION

1. Field of the Invention

The present invention is directed to a metal-to-metal antifuse structure for use in microcircuit structures such as Field Programmable Gate Arrays (FPGAs) and the like. More particularly, the antifuse structure of the present invention comprises an antifuse cell opening in which is deposited a barrier metal over which is deposited the antifuse material layer and then another barrier metal layer. In this way the capacitance of the antifuse is reduced resulting in a device compatible with higher operating speeds.

2. The Prior Art

Prior art metal-to-metal antifuse structures generally comprise a planar bottom electrode on top of which is disposed a planar barrier metal layer. An interlayer dielectric layer (ILD) is disposed over the bottom electrode structure and an antifuse cell opening is formed in the ILD to expose the bottom electrode. An antifuse material layer may then be deposited in the antifuse cell opening (or "via") and appropriate layers deposited over the antifuse material layer. The problem with this approach is that it requires a thicker barrier layer on top of the bottom electrode which is not a standard process in CMOS backend technology. For manufacturability, it is desirable to have antifuse related processes impose as little change as possible on the process technology.

OBJECTS AND ADVANTAGES OF THE INVENTION

Accordingly, it is an object of the present invention to provide a metal-to-metal antifuse structure maximizing the use of standard process steps and therefore resulting in increased manufacturability.

It is a further object of the present invention to provide a metal-to-metal antifuse having a better step coverage for the top electrode disposed within the antifuse cell opening.

These and many other objects and advantages of the present invention will become apparent to those of ordinary skill in the art from a consideration of the drawings and ensuing description of the invention.

SUMMARY OF THE INVENTION

The antifuse structure of the present invention includes a bottom planarized electrode, an ILD disposed over the bottom electrode, an antifuse cell opening in and through the ILD exposing the bottom electrode, a first barrier metal layer disposed in the antifuse cell opening to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer, and a top electrode disposed over the second barrier metal layer.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to an improved metal-to-metal antifuse structure which maximizes the use of standard CMOS process flow.

Figure 1:
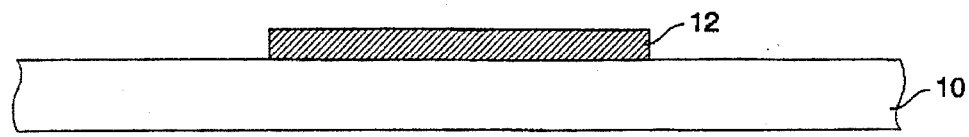
FIGS. 1–8 are diagrams showing progressive stages of construction of the metal-to-metal antifuse structure according to the present invention.
Figure 2:
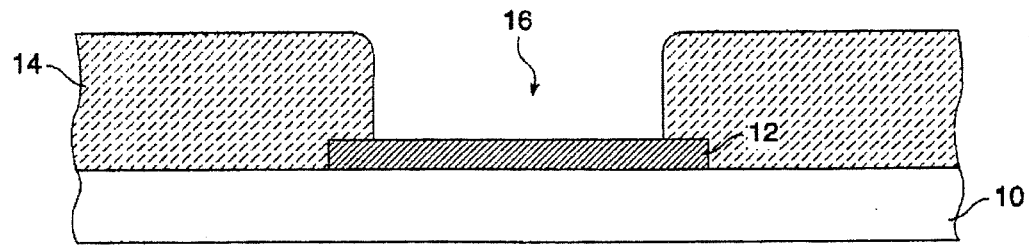
Figure 3:
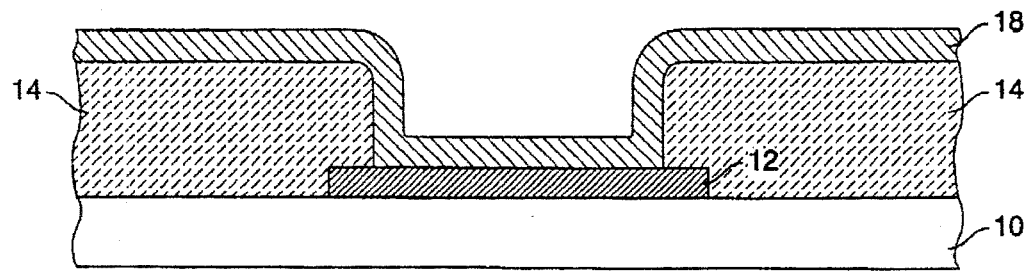

Turning to the drawings, FIG. 1 depicts a substrate 10 on which has been formed a bottom electrode 12 which will form the bottom antifuse electrode. The substrate may be any insulating portion of a microcircuit or semiconductor structure. Bottom electrode 12 is preferably aluminum of thickness in the range of 3000Å–10000Å with 5000Å presently preferred. Bottom electrode 12 can also be any standard metallization compatible with standard CMOS processes. As shown in FIG. 2, over bottom electrode 12 is formed an interlayer dielectric layer (ILD) 14 preferably of oxide of thickness in the range of 3000Å–10000Å with 4000Å presently preferred. Antifuse cell opening 16 is opened using conventional etching techniques through ILD 14 to expose bottom electrode 12 as shown. As shown in FIG. 3, a first barrier metal layer 18 is formed by a blanket deposit of a barrier metal material such as tungsten (W), titanium-tungsten (TiW), titanium-tungsten nitride (TiWN), titanium nitride (TiN), titanium (Ti), tungsten silicide (WSix), and combinations of the foregoing. Preferably barrier metal layer 18 is formed of TiN of thickness in the range of 1000Å–3000Å with 2000Å presently preferred.

Figure 4:
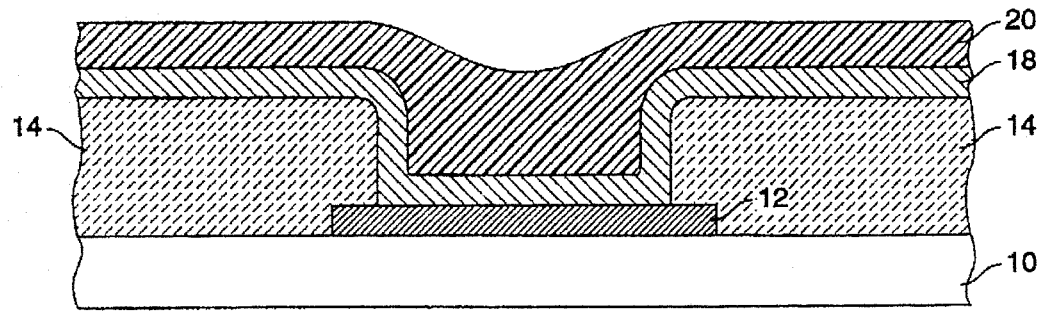
Figure 5:
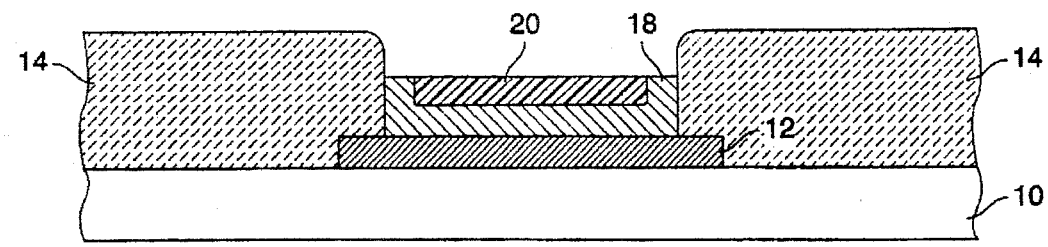
Figure 6:
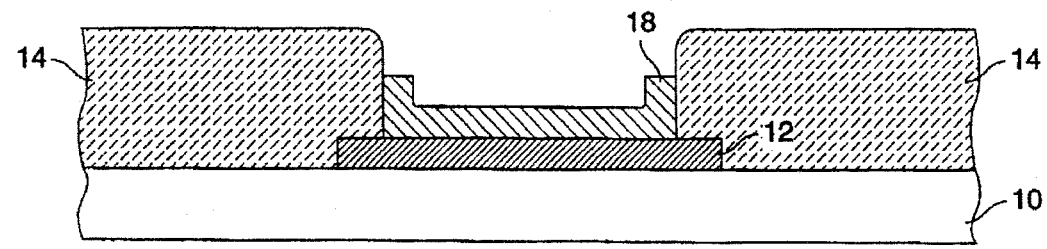
Figure 7:
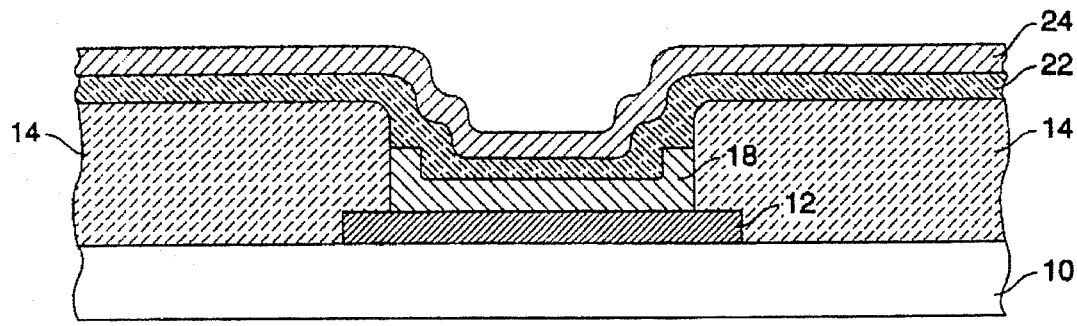

As shown in FIG. 4, a photoresist layer 20 of thickness in the range of 0.4–0.7 μm is spun on and then uniformly etched back to yield the structure of FIG. 5. Then the resist 20 remaining (FIG. 5) is stripped using conventional resist stripping techniques to yield the result shown in FIG. 6—a cup-shaped barrier metal layer 18 (Via 16 is preferably round when looking down on it).

Figure 11:
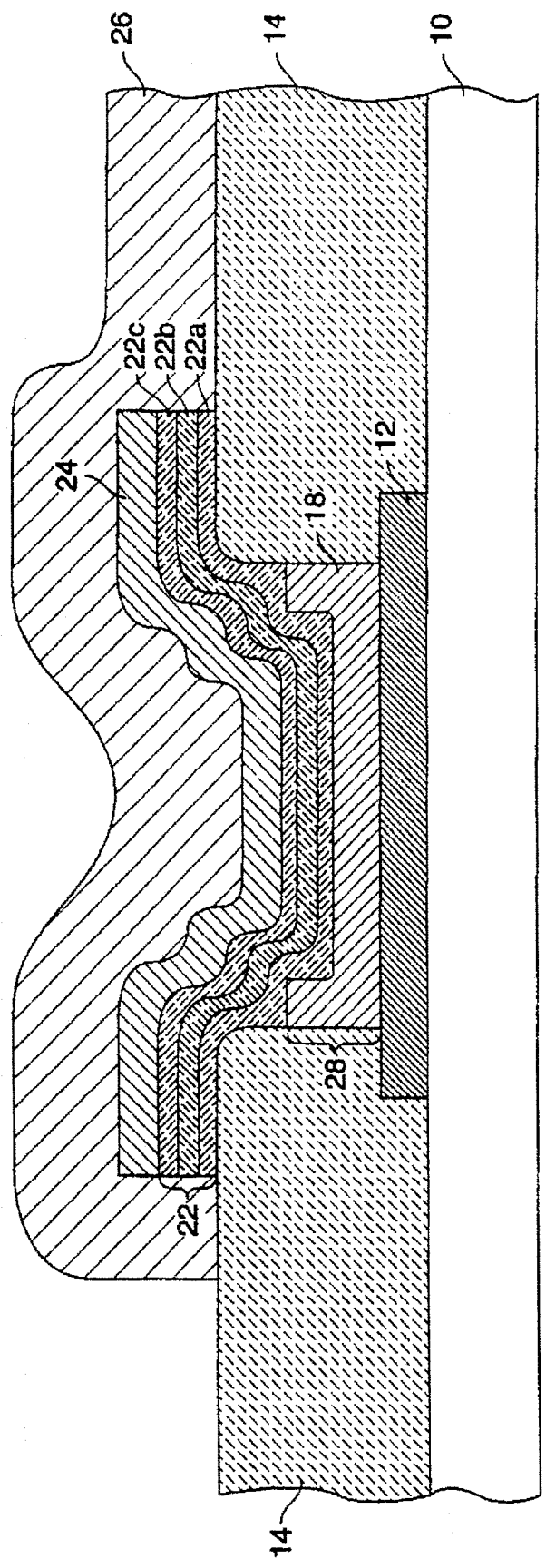
FIG. 11 is a diagram showing the three-layer antifuse embodiment according to a preferred embodiment of the present invention.

Next, antifuse material layer 22 is deposited over first barrier metal layer 18. Antifuse material layer 22 is preferably formed of a conventional nitride-amorphous silicon-nitride sandwich where the first (lower) nitride layer (22a in FIG. 11) is preferably of thickness in the range of 70Å–200Å with 100Å presently preferred; the amorphous silicon layer (22b in FIG. 11) is preferably of thickness in the range of 300Å–1000Å with 500Å presently preferred; and the second (upper) nitride layer (22c in FIG. 11) is preferably of thickness in the range of 70Å–200Å with 100Å presently preferred. Over antifuse material layer 22 is preferably deposited second barrier metal layer 24 which is preferably formed by a blanket deposit of a barrier metal material such as W, TiW, TiWN, TiN, Ti, WSix, and combinations of the foregoing. Preferably second barrier metal layer 24 is formed of TiN of thickness in the range of 1000Å–3000Å with 2000Å presently preferred.

Figure 8:
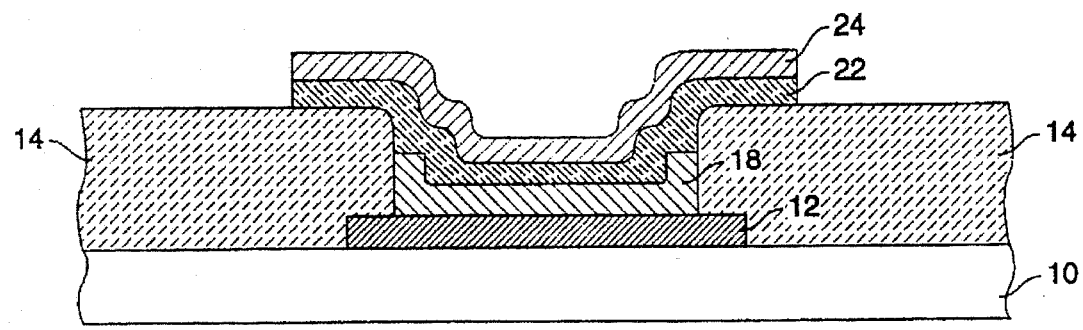
Figure 9:
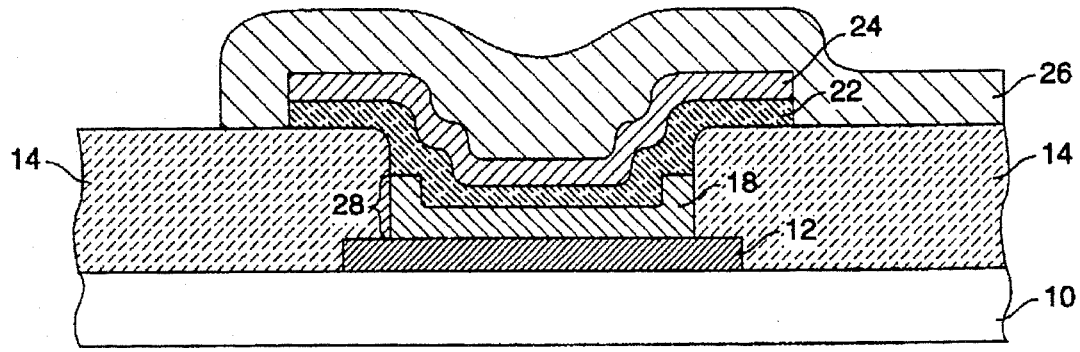
FIG. 9 is a diagram showing the completed metal-to-metal antifuse structure according to the present invention.

Next, as shown in FIG. 8, the antifuse cell is patterned and finally, as shown in FIG. 9, top electrode metallization layer 26 is formed over second barrier layer 24.

The benefits of this novel structure include its full compatibility with existing standard CMOS processes and particularly its compatibility with the standard CMOS metallization. Fuse capacitance is significantly reduced by the relatively smaller size of the first barrier metal layer versus the much larger size of the bottom electrode. Further control of the capacitance of the fuse is available by controlling the height of the sleeve 28 (FIG. 9). A shorter sleeve will give a lower fuse capacitance. Better step coverage is possible through the improved conformality for the antifuse material layer provided by the structure because the effective antifuse via depth is shallower due to the presence of the first barrier metal layer 18 within antifuse cell opening 16. Finally, a wide choice of barrier metals are available since the structure described imposes less restriction on the choice of a barrier material.

Figure 10:
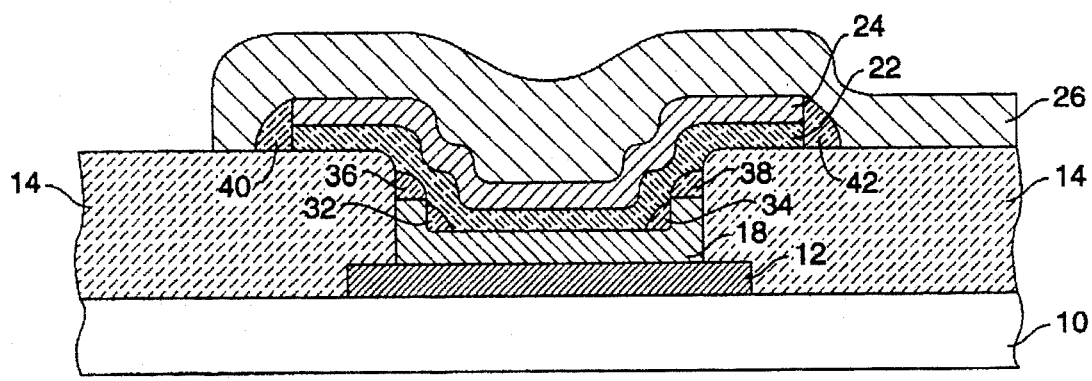
FIG. 10 is a diagram showing an alternative embodiment of the completed metal-to-metal antifuse structure according to the present invention.

According to an alternative embodiment of the present invention depicted in FIG. 10, spacers 32, 34, 36 and 38 may be added to further reduce corner effects and spacers 40, 42 reduce side diffusion associated with the top electrode 26. The spacers may be fabricated of silicon oxide, silicon nitride or amorphous silicon as is known to those of ordinary skill in the art.

Spacers 32, 34, 36 and 38 reduce the capacitance of the antifuse cell because they reduce the exposed area of bottom electrode 18. The spacer etch used for forming the spacer also serves the purpose of rounding corners 44, 46 of bottom electrode 18 as shown in FIG. 10 thus reducing the probability of antifuse defects resulting from sharp corners in the bottom electrode 18 at corners 44, 46.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An antifuse structure disposed over an insulating portion of a semiconductor substrate comprising:

a bottom electrode including an upper surface;

an interlayer dielectric layer disposed over said bottom electrode;

an antifuse cell opening in and through said interlayer dielectric layer and exposing said upper surface of said bottom electrode;

a first barrier metal layer disposed entirely within said antifuse cell opening and over and in physical and electrical contact with said bottom electrode;

an antifuse material layer disposed over said interlayer dielectric layer, in said antifuse cell opening and over said first barrier metal layer;

a second barrier metal layer disposed over said antifuse material layer; and a top electrode disposed over and in electrical and physical contact with said second barrier metal layer.

2. An antifuse structure according to claim 1 wherein said first barrier metal layer is in the shape of a cup, said cup including a bottom surface and a sleeve, said bottom surface in contact with at least a portion of said upper surface and said sleeve extending upwardly therefrom.

3. An antifuse according to claim 1 wherein said antifuse material layer includes a first nitride layer, an amorphous silicon layer disposed over said first nitride layer, and a second nitride layer disposed over said amorphous silicon layer.

4. An antifuse according to claim 2 wherein said antifuse material layer includes a first nitride layer, an amorphous silicon layer disposed over said first nitride layer, and a second nitride layer disposed over said amorphous silicon layer.

5. An antifuse structure comprising:

a bottom electrode including an upper surface;

an interlayer dielectric layer disposed over said bottom electrode;

an antifuse cell opening in and through said interlayer dielectric layer and exposing said upper surface of said bottom electrode;

a first barrier metal layer disposed entirely within said antifuse cell opening and over and in physical and electrical contact with said bottom electrode;

an antifuse material layer disposed over said first barrier metal layer;

a second barrier metal layer disposed over said antifuse material layer; and a top electrode disposed over and in electrical and physical contact with said second barrier metal layer.

6. An antifuse structure according to claim 5 wherein said first barrier metal layer is in the shape of a cup, said cup including a bottom surface and a sleeve, said bottom surface in contact with at least a portion of said upper surface and said sleeve extending upwardly therefrom.

7. An antifuse according to claim 5 wherein said antifuse material layer includes a first nitride layer, an amorphous silicon layer disposed over said first nitride layer, and a second nitride layer disposed over said amorphous silicon layer.

8. An antifuse according to claim 6 wherein said antifuse material layer includes a first nitride layer, an amorphous silicon layer disposed over said first nitride layer, and a second nitride layer disposed over said amorphous silicon layer.

\* \* \* \* \*